United States Patent [19]

Miller et al.

[11] 4,167,786

[45] Sep. 11, 1979

[54] LOAD CONTROL PROCESSOR

[75] Inventors: Edward B. Miller; Charles W. Eichelberger, both of Schenectady, N.Y.

[73] Assignee: General Electric Company, Schenectady, N.Y.

[21] Appl. No.: 871,988

[22] Filed: Jan. 24, 1978

[51] Int. Cl.² .................. G01R 21/00; H04Q 9/00
[52] U.S. Cl. .................. 364/493; 340/146.1 BA; 340/150; 364/119; 364/900
[58] Field of Search .................. 364/492–494, 364/119, 200, 900; 340/146.1 BA, 150, 151; 324/103 R; 179/2 A, 2 AM; 361/78–81, 82, 84

[56] References Cited

U.S. PATENT DOCUMENTS

| | | | |
|---|---|---|---|
| 3,405,279 | 10/1968 | Ross | 364/493 |
| 3,624,603 | 11/1971 | Delcomyn | 340/146.1 BA |
| 3,803,491 | 4/1974 | Osborn | 325/53 |
| 3,832,688 | 8/1974 | Strojny et al. | 340/147 R |
| 3,964,023 | 6/1976 | Fauchez | 340/147 PC |
| 4,022,977 | 5/1977 | Nomura | 340/151 |
| 4,060,709 | 11/1977 | Hanson | 364/493 |
| 4,075,699 | 2/1978 | Schneider et al. | 364/492 |
| 4,093,997 | 6/1978 | Germer | 364/900 |

OTHER PUBLICATIONS

"Computers in Control-Analog and Digital Techniques Control Electric Power System"; *Automatic Control;* Jan. 1962; pp. 37–43.

*Primary Examiner*—Errol A. Krass
*Attorney, Agent, or Firm*—Geoffrey H. Krauss; Joseph T. Cohen; Marvin Snyder

[57] ABSTRACT

A load control processor, for a programmable energy load controller system, includes a receiver-decoder section, a power supply section and a load switching section. The receiver-decoder section includes means for receiving an incoming data transmission encoded in a complementary-redundant error-detection code and for detecting the presence of errors in an initially transmitted address portion and a subsequently transmitted data portion of the data transmission. The power supply section includes means for recognizing the presence of a powersaver signal at the load control processor input, for removing power from the majority of the load control processor logic, when data reception and load change processing are not occurring, to reduce total power consumption of the load control processor.

11 Claims, 6 Drawing Figures

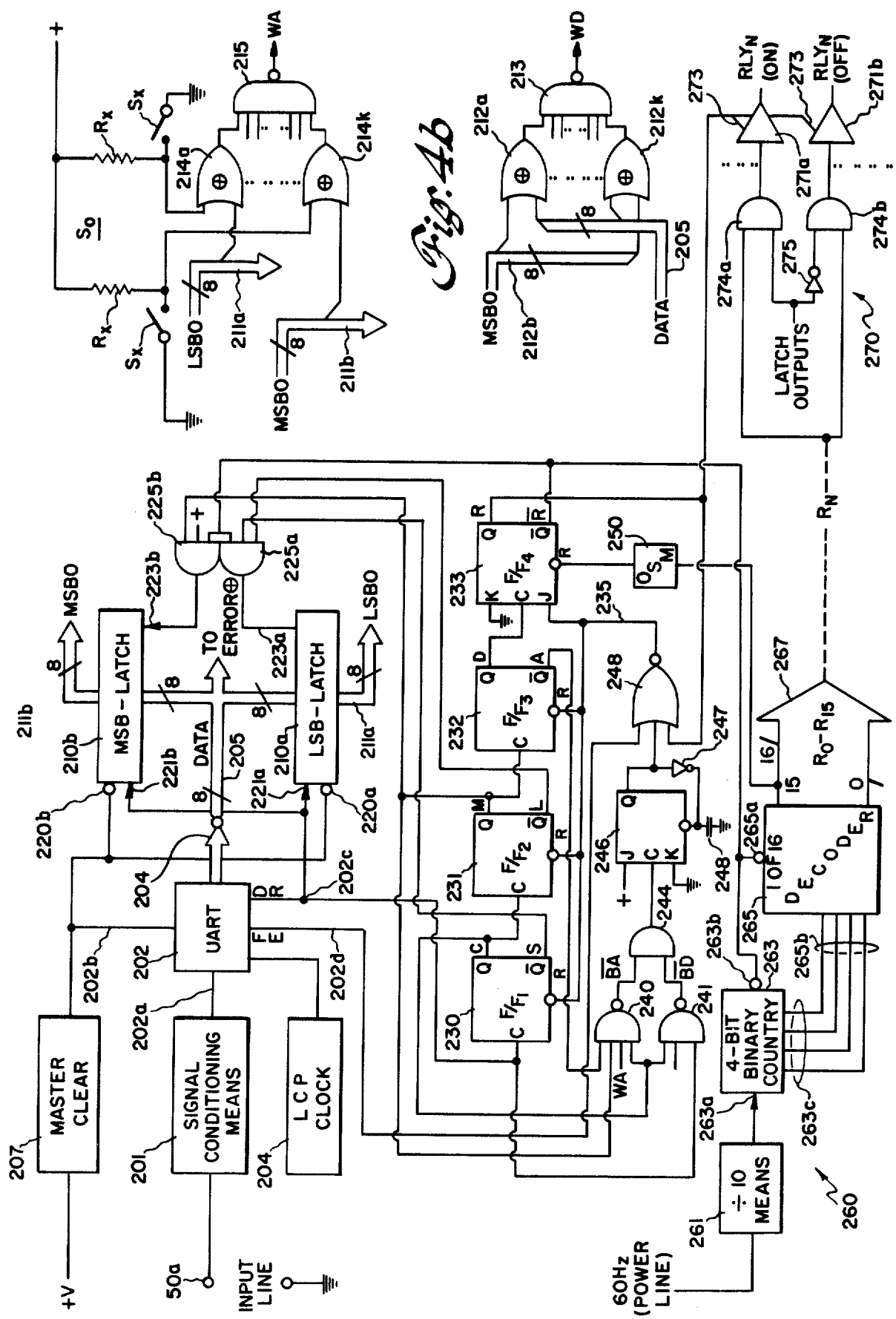

4,167,786

LOAD CONTROL PROCESSOR

BACKGROUND OF THE INVENTION

The present invention relates to systems and methods for controlling energy loads and, more particularly, to a novel load control processor for use in a programmable energy load controller system capable of establishing the energy consumption state of a multiplicity of load devices.

It is known that the quantity of energy consumed, and the cost thereof, in a building can be minimized by allowing energy consumption to occur only at such times as benefit can be obtained therefrom. One approach to minimization of energy consumption in a building, such as an office building and the like, has been to utilize one or more employees, moving through the building, to switch off those loads which represent non-beneficial energy consumption. This approach does not, however, provide rapid control of energy consumption, due to the difficulty and expense of having personnel present at all loads at all times. An automatic system for controlling the energy loads is thus desirable.

BRIEF SUMMARY OF THE INVENTION

In accordance with the invention, there is provided a load control processor for use in a programmable energy load control system for controlling the energization and deenergization, as well as the establishment of a particular one of several levels of energization, of each of a multiplicity of energy loads.

A central facility is coupled in electrical parallel connection to the input of each of a plurality of load control processors (LCP), each having a receiver/decoder with a unique, predetermined address and means for controlling a plurality of energy switching devices located in the area adjacent to each LCP.

In one presently preferred embodiment, data is sent from the central facility to the paralleled LCPs in an error-self-checking format with each byte of address data being first transmitted in a complementary (inverted) form and thence in a true form, and with each LCP's receiver/decoder containing circuitry for storing the inverted byte for comparison with the true byte and issuing an error message, preventing enablement of operations requested by functional data bytes, if similarly ordered bits of the data-true and data-complement bytes are identical. The paralleled LCPs are driven by a media interface means having the capability for also providing a signal which causes all of the LCPs coupled thereto to enter a powersaver mode, whereby a major portion of the LCP circuitry is deenergized, to reduce power consumption (and protect and increase the reliability of the components in the LCP) during time intervals when load changes are not being actuated.

Accordingly, it is an object of the present invention to provide a novel load controller processor for use in a programmable energy load controller system.

This and other objects of the present invention will become apparent to those skilled in the art upon consideration of the following detailed description taken in conjunction with the drawings.

BRIEF DESCRIPTION OF THE DRAWINGS

FIG. 4b is a circuit diagram of the receiver/decoder circuitry of the load control processor of FIG. 4a; and FIG. 4c is a schematic diagram of one embodiment of a powersaver regulating-power-supply circuit utilizable in the load control processor of FIG. 4a.

DETAILED DESCRIPTION OF THE INVENTION

Figure 1:
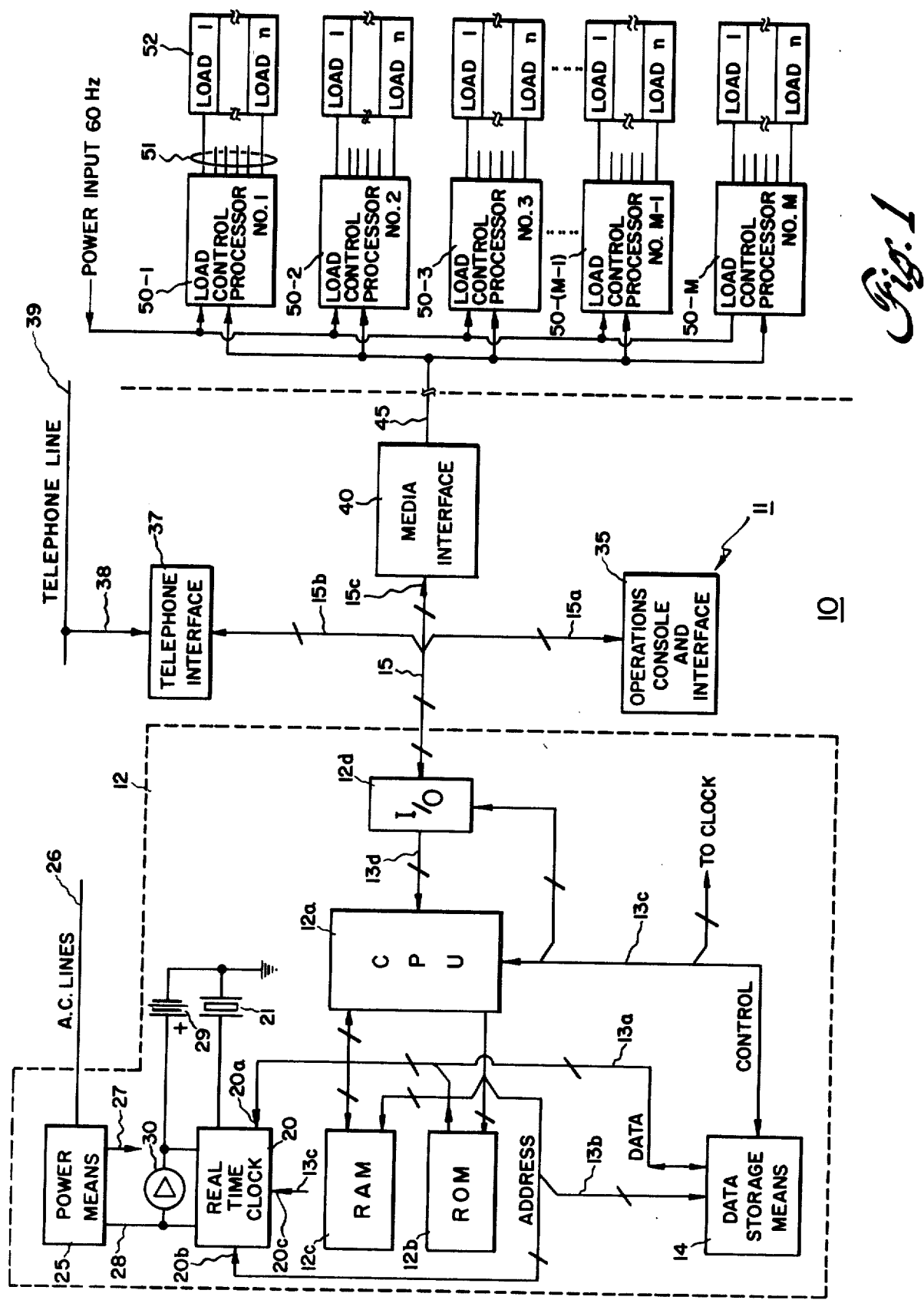
FIG. 1 is a block schematic diagram of a novel programmable energy load controller system using a plurality of load control processors in accordance with the principles of the present invention.

An overall block diagram is shown in FIG. 1 of one presently preferred embodiment of a novel programmable energy load controller system 10. A central facility 11, shown generally to the left of the vertical broken line, comprises a microcomputer 12, such as a standard INTEL MDS-800 microcomputer, containing a central processing unit (CPU) 12a; read-only-memory (ROM) means 12b (of about 6 kilobyte capacity) typically an INTEL MDS-406 PROM module in the microcomputer; read-write random-access-memory (RAM) means 12c (of about 16 kilobyte capacity); and an input-/output (I/O) means 12d including I/O means in the MDS-800 plus an additional INTEL MDS-504 I/O module in the microcomputer. The microcomputer also contains suitable multi-wire signal path structures, commonly known as a data bus 13a, an address bus 13b and a control bus 13c, interconnecting the CPU, ROM, I/O and RAM means, and an I/O bus 13d coupling the CPU and I/O means. The various parallel bus structures 13a, 13b and 13c are coupled to a mass data storage means 14, which may be a magnetic tape transport and controller, a magnetic disk, data cassette transport mechanism and the like, for storage of large quantities of data which may be written into and read from data storage means 14 via data bus 13a, under control of CPU 12a. Data storage means 14 may be physically located within microcomputer 12 or adjacent thereto, with proper coupling of the data, address and control buses thereto.

The data bus 13a is of the bidirectional type, whereby data may be read from data storage means 14 into temporary data storage means such as RAM 12c, or vice-versa, under control of CPU 12a and programs executed therein, in manner known to the computing arts. Data may be received in the microcomputer 12 via a parallel and/or serial input bus (or buses) 15 from sources external to the microcomputer.

Also contained within microcomputer 12 is a real-time clock module 20, utilizing a high-stability crystal element 21, to continuously and accurately establish the time-of-day (TOD) and day-of-week (DOW). Real-time clock means 20 is coupled to bidirectional data bus 13a at clock data port 20a, to address bus 13b at clock address port 20b, and to control bus 13c at clock control port 20c, to facilitate entry of clock starting time data upon energization of the load controller system of the present invention, and to facilitate reading the TOD and DOW data from clock means 20 when the clock means is interrogated with address codes, at port 20b, corresponding to the unique address codes previously assigned to the clock. Real-time clock means 20 is advantageously fabricated upon a printed circuit board, or other like means, of similar size as that used for mounting the components of the other portions of the microcomputer, and the real-time clock means, along with its timing element 21 and a rechargeable battery means 29, is physically positioned within the confines of the microcomputer at the central facility.

A power supply means 25 is coupled to the AC power line 26 in the building housing the central facility and is coupled to the microcomputer 12, via connections 27 and 28, to provide the required operational voltages and currents. DC power connection 28 provides the real-time clock with operating power derived from the commercial power means, and is coupled to a back-up battery 29 via a battery charging circuit 30 which allows charging current to flow easily in the direction of the battery such that in the event that AC mains power is lost for any reason, the battery is isolated from means 25 and remains coupled only to real-time clock 20 to assure that the timekeeping function of the clock is maintained. Upon reestablishment of mains power, a bootstrap program directs the CPU to place on address bus 13b the sequential addresses of the clock portions storing TOD and DOW data such that the system will then implement the load energization pattern required for that particular time.

An operations console and interface 35, such as a General Electric TERMINET 30 ® data terminal and the like, is generally physically located near the central computer and is coupled to the I/O bus via bus portion 15a and thence to I/O means 12d of the computer. Console 35 allows system personnel to load, debug and/or modify system programs as well as perform computer diagnostic routines, as required, and in manner known to the art.

A telephone interface means 37, such as a standard AT&T 407A data set and the like, receives tone-coded serial data, coupled via bus 38 to a telephone line 39, which may be a dedicated telephone number in a building-wide telephone system and the like, and decodes this data prior to coupling the data via a portion 15b of the I/O bus to the computer, in manner known to the art.

The central facility is substantially completed by a media interface means 40 serving to couple a portion 15c of the I/O bus to transmission media 45 serving to carry signals representative of data to and from the central facility and the inputs of each of a plurality of remotely-located load control processors 50-1 through 50-M. Media 45 is preferably a cable running between media interface 40 and each of the parallel inputs of the load control processors 50. In our preferred embodiment, transmission medium 45 is a pair of twisted wires, although a coaxial cable may be equally as well utilized.

Thus, I/O means 12d may have at least the following I/O port assignments:

| I/O PORT ASSIGNMENT TABLE | | | |
|---|---|---|---|
| PORT NO. | CONTROL LINE | ASSIGNMENT | ADDRESS |
| 1 | Output | Terminet ® and Mass Storage Control | OF7H |
| 2 | Input | Terminet ® and Mass Storage Status | OF7H |
| 3 | I/O | Terminet ® and Mass Storage Data | OF6H |
| 4 | Input | Mass Storage Status Flags | O23H |

-continued

| I/O PORT ASSIGNMENT TABLE | | | |
|---|---|---|---|
| PORT NO. | CONTROL LINE | ASSIGNMENT | ADDRESS |
| 5 | Output | LCPs Data | OF4H |
| 6 | Output | Interface Data (PSUR, etc.) | OF5H |
| 7 | Input | Interface Status | OF5H |
| 8 | Input | Telephone Data | O21H |
| 9 | Input | Telephone Interface Status | O22H |
| 10 | Output | Telephone Interface Control | O21H |

Each load control processor 50 is assigned an address unique to that load control processor (LCP), even if more than one load control processor is physically located at the same location within the facility. Each of load control processors 50, when properly addressed and enabled, decodes function data transmitted from the central facility thereto, for energization of combinations of the LCP output lines 51 to enable or disable one of a plurality (n) of loads 52 coupled to each LCP. Additionally, in our preferred embodiment, each LCP is configured to not only enable and disable energy consumption by one of the n loads coupled thereto, but also, when our energy load controller system is utilized for controlling lighting functions and the like, to enable each lighting load (a single fixture, bulb and the like) to one of a plurality of different energized conditions. Thus, where a single lighting fixture contains a lighting load capable of being switched between the "off" condition, a low-light "on" condition and a high-light "on" condition, the load control processor associated with each such load is configured to properly place that specific load in the desired one of the plurality of possible energy consumption states.

In our preferred embodiment, each of the Mxn loads is a latching relay associated with either the on-off function or a high lighting level/low lighting level function of each one of a plurality (Mxn/2) of lighting fixtures provided in at least one building to be controlled by our novel system. The number of fixtures controlled by a single LCP is related both to the number of states of energy consumption definable per fixture; the number of bits in a data word defined for the particular CPU utilized in computer facility 12; and the number of function words to be transmitted in a single message to the paralleled plurality of LCPs. In the embodiment herein illustrated, the INTEL MDS-800 microcomputer utilizes the well-known 8080 CPU integrated circuit, for which the data word is defined as being 8 bits (1 byte) wide. We have arbitrarily chosen that only two data words be sent in serial fashion to each uniquely addressed one of the LCPs; each lighting fixture requires information contained in two binary data bits (the "on-off" function bit and the "high-low" function bit) whereby the "on/off" states of a set of eight fixtures are controlled by a first data byte and the "on-hi/on-lo" states of the eight fixtures are controlled by the second byte of the preferred two-byte sequential data function message. Of course, it should be understood that other CPUs may be utilized, whereby a particular data word may have more or less bits and that a single data word, or more than two data words in succession, may be as easily transmitted to the paralleled multiplicity of LCPs; other microprocessor CPUs are well known to the art, having four, twelve or sixteen bit data words, and minicomputers and large mainframe computers having data words up to at least sixty-four bits are also known-these CPUs may be utilized within the intent and spirit of the present invention. It should also be understood that other specific load control coding arrangements may be utilized, e.g. a lighting load having an "off" and three "on" conditions (such as a common three-way incandescent bulb and fixture therefor), which four energy utilization state combinations may be coded with the appropriate ones of the four possible combinations available from two sequential binary digits. Similarly, other common non-lighting types of energy consumption loads may be controlled to a lesser or greater degree of possible states, e.g. air conditioning duct dampers may be controlled to one of eight air-flow positions, including zero air flow, by suitable choice of combination of three binary digits in a data word, and so forth. Further details concerning operation of this system may be obtained by reference to our co-pending application Ser. No. 871,989 (filed on even date herewith), and incorporated hereby by reference.

Figure 2:
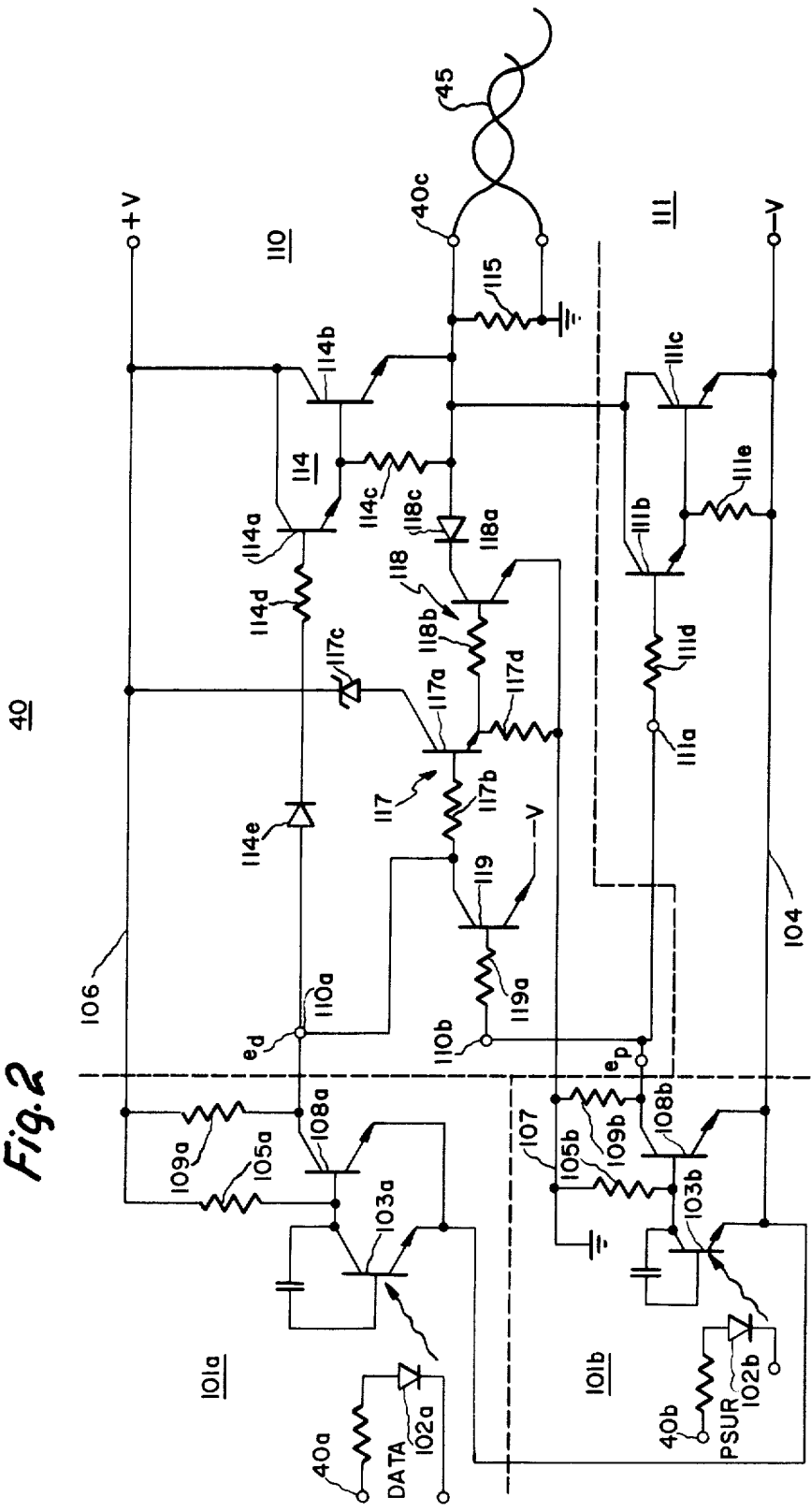
FIG. 2 is a schematic diagram of one embodiment of a media interface for use in the system and useful in understanding the transmission of signals to a load control processor.

Referring now to FIG. 2, media interface means 40 couples to the preferred twisted-pair media 45 both a data signal, having a binary one level of about $+V$ volts and a binary zero level of about 0, or ground potential, volts as well as a power saver (PSVR) signal which is a negative voltage of about $-V$ volts for the purpose of turning off a major part of each load control processor 50. Each of the data and power saver signals is received by an identical input section 101a or 101b, utilizing optical coupling techniques between a current-limited photodiode 102a or 102b and an associated phototransistor 103a and 103b. The emitters of both phototransistors 103 are coupled to the negative potential bus 104, while the collector of the first phototransistor 103a is coupled via a load resistor 105a to the positive voltage bus 106, and the collector of the second phototransistor 103b is coupled via another load resistor 105b to the ground bus 107. The collector of each phototransistor is coupled through a DC amplifier transistor 108a and 108b, respectively, with its associated load resistance 109a and 109b, respectively, to provide isolated and amplified data and powersaver signals $e_d$ and $e_p$, respectively, to the media data driving circuitry 110 and powersaver driving circuitry 111.

In the absence of a PSVR input, driving voltage $e_d$ is coupled to the input of the Darlington amplifier 114 coupled between the positive bus 106 and output resistor 115. The driving signal is also coupled via emitter follower 117, comprised of transistor 117a, base resistor 117b, Zener diode 117c and emitter resistor 117d, to an output stage 118, comprised of a transistor 118a, its base resistor 118b and a collector diode 118c, with the collector diode-transistor collector-emitter circuit coupled across output load 115. A binary one (positive true) signal at input 110a causes Darlington amplifier 114 to saturate, while causing transistors 117a and 118a to enter the cut-off state, whereby the interface means output 40c is forced to a voltage approximating the $+V$ potential, in logic one condition. When a data zero signal appears at data input 40a, a logic zero signal appears at amplifier input 110a, driving Darlington 114 to the cut-off state and allowing the voltage at output 40c to fall to approximately ground potential. The foregoing is true if the powersaver input 40b does not have a powersaver signal present, whereby the input voltage $e_p$ at both the powersaver amplifier input 111a and the data amplifier auxiliary input 110b is a binary zero level of approximately $-V$ volts, cutting off the powersaver amplifier Darlington transistors 111b and 111c to prevent any interaction thereby with the data levels across output load 115. The large negative voltage at auxiliary data amplifier input 110b biases the associated transistor 119, via its base resistor 119a, into the cut-off condition, whereby transistor 119 does not affect the voltage at data amplifier input 110a.

When a powersaver signal is present at powersaver input 40b, the signal $e_p$ has a binary one voltage of approximately ground potential. This ground potential at powersaver amplifier input 111a causes saturation of the Darlington transistors 111b and 111c and pulls the interface means output 40c to the negative voltage $-V$. Simultaneously, transistor 119 is saturated, placing a negative voltage signal at data amplifier input 110a to place both the Darlington output circuit 114 and the pull-down transistor 118a in their respective cut-off conditions, removing all influence thereof on the voltage state of the output. Collector diode 118c is now utilized to prevent damage at the collector electrode of the reverse-biased transistor 118a. Thus, it is seen that the PSVR signal takes precedence over all data signals and prevents transmission of the latter over the system media 45.

Figure 3:
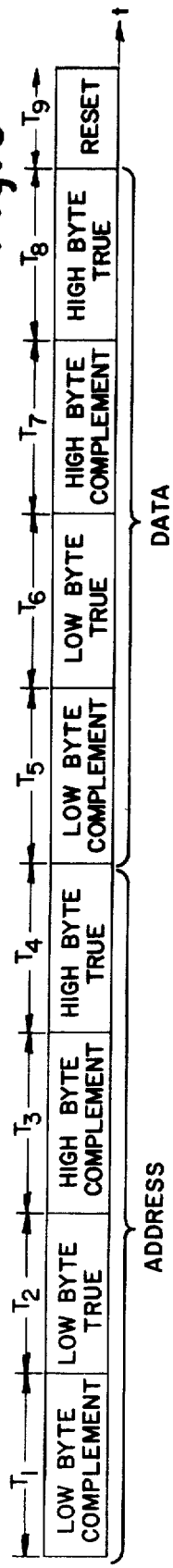
FIG. 3 is an illustration of the transmitted data format used in one embodiment of the system.

Referring now to FIG. 3, when data is present, data is transmitted to the receivers/decoders, of the individual load control processors, over the dedicated two-wire transmission link at a high data transfer rate of about 2400 bits per second, with a high noise immunity being achieved by utilizing: a complementary-redundant error-detecting code; a large voltage swing between the two logic levels transmitted; and a threshold-crossing data recovery technique at the receiving end. The data transmission format thus transmits the two-byte address code commencing with the low-order byte (as required by the particular data format of the 8080 microprocessor utilized in the illustrated embodiment) which low-order byte is first transmitted as 8 bits of complementary data in time interval $T_1$ and is followed by the eight bits of the low order address byte transmitted as true (or non-complemented) data in time interval $T_2$. The high order eight-bit address byte follows with the complement of the eight data bits being first transmitted in time interval $T_3$ and followed by the eight bits of the high order byte transmitted in data-true manner in the fourth time interval $T_4$. Thus, if the sixteen-bit address of a particular receiver/decoder to be addressed is $47AF_H$, or 0100011110101111 in binary, the transmitted address will be 01010000 in time interval $T_1$ (the complement of the low order byte), followed by the eight bit true low-order byte 10101111, in time interval $T_2$, followed by the high-order byte complement eight-bit pattern 10111000, in time interval $T_3$ and ending the address portion of the transmission with the high order byte data-true eight-bit pattern 01000111. The following two bytes of data are also transmitted with the low-byte in complementary form during time interval $T_5$ followed by the low-order byte in true-data form during time interval $T_6$, and then the high-order byte in complementary data form during interval $T_7$ with the true-data representation of the high order bit following time interval $T_8$. A framing error is transmitted during a time interval $T_9$ to act as a reset at the end of the address-data transmission.

Figure 4A:
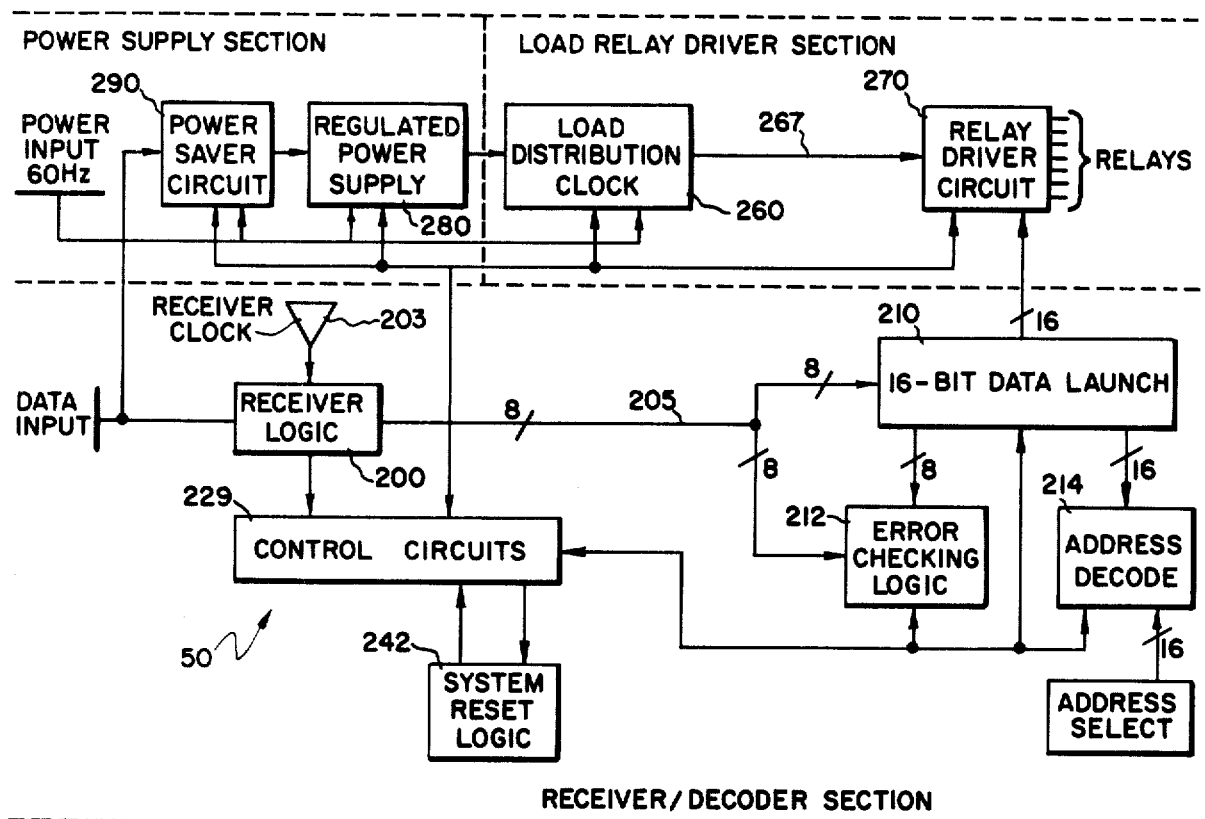
FIG. 4a is a block diagram of one embodiment of the novel load control processor of the present invention.

Referring now to FIGS. 4a and 4b, the data input from transmission media 45 is received at load control processor input 50a, and is coupled to receiver logic circuitry 200, preferably comprised of some signal conditioning means 201, including low pass filtering means for removing high frequency interference from the incoming signal and means, such as a Schmitt trigger and the like, for restoring sharp leading and trailing bit edges. The conditioned signal is coupled to a universal asynchronous receiver-transmitter (UART) 202 at the data input 202a thereof. A load control processor clock 203 is coupled to the clock input of the UART; the clock serves to establish the bit rate acceptable for reception by the UART. Signal transmission through media 45 and into UART 202 is in serial fashion. The UART, having been previously reset by the application of a reset signal at reset input 202b coupled via master clear 207 to the potential energizing the entire receiver/decoder, receives the eight serial bits and simultaneously presents these eight bits, through a set of inverters 204, on an eight-bit-wide parallel data bus 205, when a data ready (DR) output 202b is enabled for a short time interval.

The data bus is coupled to a sixteen-bit wide data latch 210 comprised of a pair of eight-bit data latches 210a and 210b having their data inputs coupled in parallel to bus 205. The less significant byte of each of the address and data words are stored in the less significant byte (LSB) latch 210a while a more significant byte is stored in the remaining (MSB) latch 210b, when the respective data latch is properly controlled to the storage condition by control circuitry outputs to be described hereinbelow. The eight-bit wide data bus is also coupled to error checking logic exclusive-OR gates 212 in manner such that the data line assigned to the most significant bit is coupled to first exclusive-OR gate 212a and the remainder of the lines are coupled in sequential order to sequential exclusive-OR gates 212 until the data line assigned to the least significant bit is coupled to one input of the last exclusive-OR gate 212k. The remaining input of each exclusive-OR gate 212 is coupled to one associated bit on paralleled MSBO output bus 211b from the more significant byte latch 210b. The output of each of the exclusive-OR gates 212 is coupled to one input of a k-input NAND gate 213 to generate a wrong data (WD) signal, as required and hereinbelow explained.

Similarly, a plurality of exclusive-OR gates 214a–214K have one input terminal thereof coupled to one different output line from the LSBO and MSBO busses, with a remaining gate input coupled to one switch $S_x$ of a receiver/decoder address determination switch assembly $S_o$. The switch is coupled between the remaining gate input and ground, with a pull-up resistor $R_x$ being coupled between that gate input and a positive voltage. The output of each of exclusive-OR gates 214 is coupled to an associated input of a k-input NAND gate 215 to generate a wrong address (WA) signal as described hereinbelow.

Each of latches 210a and 210b has a reset input 220a and 220b, respectively coupled to the reset output of the master clear circuitry 207 via a jumper 208; a first latch enable input 221a and 221b, respectively, is coupled to the data ready output 202c of the UART; and a second data-load input 223a and 223b, respectively, is each driven by the output of a three-input AND gate 225a and 225b, respectively.

Control circuitry 229 includes four flip-flops 230–233 used as a state-sequence counter; the clock input C of first flip-flop 230 is coupled to the data ready output 202c of the UART, with the clock input of each following flip-flop being coupled to the Q output of the preceding flip-flop. The J and K inputs of the first three flip-flops 230–232 are coupled to a positive potential (not shown for purposes of simplicity) while the K input of the last flip-flop 233 is coupled to ground potential and J input of flip-flop 233 is coupled to reset bus 235, which bus is also coupled to the reset inputs R of the preceding three flip-flops 230–232. The Q output of first flip-flop 230 is coupled to one input of each of a pair of NAND gates 240 and 241, while the $\overline{Q}$ output of flip-flop 230 is coupled to one input of AND gate 225a; the Q output of flip-flop 231 is coupled both to one input of AND gate 225b and to one input of NAND gate 240; The $\overline{Q}$ output of flip-flop 231 is coupled to one input of AND gate 225a; the $\overline{Q}$ output of flip-flop 232 is coupled to another input of NAND gate 240, while the $\overline{Q}$ output of last flip-flop 233 is coupled to to an input of both AND gates 225a and 225b. The remaining input of AND gate 225 is coupled to a positive potential (logic one level).

NAND gates 240 and 241 form a portion of system reset logic circuits 242, in conjunction with AND gate 244, having an input thereof coupled to the output of each of NAND gates 240 and 241, and another J-K flip-flop 246, receiving its clock input from the output of gate 244 and having its J-input coupled to a positive potential and its K-input coupled to ground potential. The Q output of flip-flop 246 is coupled back to its reset R input via an inverter 247 and a time delay capacitor 248; the Q output is also coupled to one input of a three-input NOR gate 248, receiving the Q output of flip-flop 233 at another input and a framing error (FE) output of UART 202 at its remaining input. The output of NOR gate 248 generates the reset signal on line 235.

The reset R input of flip-flop 233 is formed by a one shot multivibrator (OSM) 250 acting on the output of load distribution clock means 260. The load distribution clock receives the 60 Hz. power line frequency and includes a divide-by-10 frequency divider 261 coupling its 6 Hz. output frequency to the input 263a of a four-bit binary counter 263. Counter 263 has its reset input 263b coupled to the $\overline{Q}$ output of flip-flop 233, along with the reset input 265a of a one-of-sixteen decoder 265. Each of the four outputs 263c of the binary counter are coupled to the corresponding one of four inputs 265b of the decoder. The sixteen individual decoder outputs $R_O$–$R_{15}$ are coupled via a sixteen-wide relay bus 267 to a set of sixteen relay driver circuits 270; the last decoder output $R_{15}$, i.e. the sixteenth bit, is coupled to OSM 250 to form the reset signal for flip-flop 233.

As previously explained hereinabove, each LCP is capable of operating sixteen relays, with two relays typically being required for a lighting fixture having both an "on-off" function and a "high-low" intensity function. Each of the relays is a latching type, being pulsed with current flow in a first direction to latch in a first condition and being pulsed with a current flow in another direction to latch in the remaining condition. The drivers for relay $R_N$, where $1 \leq N \leq 16$, comprise a pair of high-current buffers 271a and 271b, each having its output coupled to the particular relay N respectively for enabling the "on" and the "off" condition; and having a strobe input 273 coupled in parallel to the Q output of flip-flop 233. Each relay driver input is coupled to the output of an associated AND gate 274a and 274b, respectively, each having one input thereof coupled to a different single one of the sixteen relay output lines from decoder 265. The remaining input of the AND gate 274a associated with the "on" state, and the input of the remaining AND gate, coupled through an inverter 275, is coupled to the bit output of that one bit of the data latch 210 assigned to that particular relay. It should be understood that we prefer to transmit the first byte of data (fixture "on-off") information in inverted logic fashion and the last byte of data (fixture "hi-lo") information in non-inverted fashion, and place the relay driver inverters 275 for only the first 8 relays in the input circuit of gates 274a (with the inverters in the last 8 relay drivers being coupled as shown) for facilitating implementation of a "power-up-reset" mode hereinbelow described. It should be further understood that while a single relay driver circuit 270, for a single relay, is shown in FIG. 13b, an additional fifteen such circuits are utilized for the remaining fifteen relays actuatable by the single load control processor of the present embodiment.

In operation, assuming a powersaver signal is not present on the data input line, the data sequence shown in FIG. 13b is received and conditioned by means 201 and is loaded into UART 202 in serial fashion. All of flip-flops 230-233 and 246 have previously been reset whereby the respective Q outputs are at a binary zero level. The first eight-bit-serial signal is loaded into UART 202 responsive to, and enabled by, timing pulses from the load control processor clock 204. The single byte signal is assembled and presented as an eight-bit parallel signal at the output of the UART; inverters 204 act to convert the complement data, initially received, to true-data placed on data bus 205 when the data ready (DR) output 202c is enabled. The DR signal enables both latch first inputs 221a and 221b, while the enabled $\overline{Q}$ outputs of flip-flops 230, 231, and 233 are combined in AND gate 225a to enable the LSB latch 210a second input 223a, to clock the eight bits of parallel data into the LSB latch and present the data at the latch output LSBO. The MSB latch second input 223 is also enabled as the second AND gate does not receive the Q output of flip-flop 231 at its input, but does receive a continuous logic enable (positive voltage) signal instead. The first DR signal appears at the clock input of flip-flop 230 and toggles the first flip-flop such that, after the first byte of information is loaded into the LSB latch 210a, flip-flop 230 has energized its Q output and de-energized its $\overline{Q}$ output.

The second (address low order true) byte of data is transmitted to the receiver decoder and loaded into UART 202 and then inverted by inverters 204 for presentation in parallel on data bus 205, simultaneous with enablement of DR output 202c. As the $\overline{Q}$ signal from flip-flop 230 is disabled, second LSB latch input 223a is disabled and the true data is not stored in latch 210a. The now-complemented data on data bus 205 is routed to exclusive-OR gates 212, whereby comparison is made with the now-true output of the MSBO bus 211b. If the complementary data on data bus 205 is the bit-for-bit complement of the true data now on MSBO bus 211b, the output of each exclusive-OR gate 212a-212k is enabled and the output of NAND gate 213 is disabled, indicating that proper first address byte data has been received. Conversely, if even one bit of either the complementary-data or the true-data word is improper, the WD output of gate 213 is enabled and is coupled to NAND gate 241, which gate has its remaining two inputs enabled by the presence of DR signal from the UART and the enablement of the Q output of flip-flop 230. In such case, the $\overline{BD}$ output of gate 241 is disabled and provides a falling clock pulse to flip-flop 244c which generates a reset pulse to NOR gate 248 coupled to the control logic reset line 235 to reset all flip flops and prevent the receiver/decoder from taking any action pursuant to the address-low-order-byte code having transmission errors associated therewith.

Assuming that the low order byte complementary-data and true-data transmissions have been error free, the outputs 211a of the LSB latch contain the address low-order-byte true-data code. The address high-order-byte is now transmitted with an eight-bit complementary code, which appears inverted and in parallel on data bus 205, simultaneous with the third enablement of the DR output 202c. The previous DR output had retoggled flip-flop 230 such that the $\overline{Q}$ output was enabled, and had also goggled second flip-flop 231 such that its Q output was enabled (indicating that the more significant byte is to be operated on). The inputs of gate 225b being all enabled, the second gating input 223b of MSB latch 210b is enabled, such that the now-true data on bus 205 is loaded into MSB latch 210b at the third DR enablement. The address more-significant-byte true data is now present on MSB latch output bus 211 and one bit thereof is coupled to each of exclusive-OR gates 212. The third DR enablement also toggles flip-flop 230 such that the Q output thereof is again enabled. As at least one input of AND gate 225a is disabled, the data in LSB latch 220a is unaffected.

The high-order-address data-true byte is received at the UART and presented in inverted manner and in parallel on data bus 205. As both of gates 225a and 225b are disabled by the disablement of the $\overline{Q}$ output of flip-flop 230, this complementary-data byte is not loaded into either latch 210, but is coupled in bit-by-bit fashion to the remaining inputs of checking gates 212a-212k, where the bit-by-bit complementary nature of the true-data and complementary-data bytes are checked and a reset signal issued if the data bits are not full complements of each other, as previously explained hereinabove. If all data bits are correctly received, and no reset signal is present, the outputs 211a and 211b of the respective LSB latch and MSB latch, respectively, are routed bit-by-bit fashion to associated inputs of address-checking exclusive-OR gates 214a-214k. The remaining inputs of exclusive-OR gates 214 are either enabled or disabled by means of the pull-up resistors and grounding switches, previously set to encode the complement of unique address assigned to the particular load control processor receiver/decoder. The data on both latch output busses 211a and 211b are, as previously mentioned, in true-data form, which is exclusive-OR'd to the complementary-data address configuration of the switches and pull-up resistors and causes the outputs of each gate 214 to be enabled only if the corresponding bit of switch matrix complementary data is indeed the complement of the true-data established at the latch outputs. Therefore, gate 214 outputs are enabled and the output of NAND gate 215 is disabled, indicating a proper address. If one or more of gates 214a are disabled (indicating that at least one bit of the address data received is not the same as the corresponding bit of the preselected address) the output of gate 215 is enabled to signify that a wrong address (WA) has been received. The WA signal is received at NAND gate 240, having the remainder of its inputs enabled respectively by the Q output of flip-flop 230, the Q output of flip-flop 231 and the $\overline{Q}$ output of flip-flop 232. Thus, the output of gate 240 is disabled, indicating a bad address ($\overline{BA}$) condition, which causes the output of gate 244 to fall and toggles the reset flip-flop 246 to place a reset on control reset line 235 and effectively terminate action by the receiver/decoder.

The correct address having been received, and third flip-flop having had its Q output enabled by the fourth DR signal at UART output 202c, the receiver/decoder is now ready to receive the high and low order data bytes in successive complementary/true fashion. The low order complementary data byte is received, inverted and clocked into both LSB and MSB latches 210a and 210b in the same manner as the low order inverted-complementary address byte was stored in latch 210. Thence, the low order data-true byte is received, inverted and compared with the true data now available on the MSB latch output bus 211b, by the exclusive-OR gates 212 and gate 213. If the low-order data byte is properly received, the high order data byte complementary-data bits are next received, inverted and stored only in MSB latch 210b, and the high order data true-data bits are inverted and made available on bus 205, in the same manner that the low order address bytes were received, as hereinabove explained. The high order data byte complementary and true data bits are also compared in gates 212 and if no data transmission errors are detected, the operation of the receiver/decoder continues. If a data error is detected, the wrong data WD output of gate 213 is enabled, to disable the output of gate 241 and cause a reset to be generated on control logic reset line 234, preventing continued processing of the incorrect data received.

When a transmission is received containing the proper address previously assigned to the particular receiver-decoder, and containing two bytes of errorless data, the "data ready" signal associated with the data-true high order data byte transmission toggles all of flip-flops 230, 231 and 232 to disable the Q outputs thereof; the clock input of the fourth flip-flop 233 is thus toggled and brings the Q output thereof (the relay ready state) to its activated condition, to enable relay strobe line 273, as well as to enable the remaining input of NOR gate 248 to generate a reset signal on line 235 and reset the control logic preparatory to receipt of a next data transmission to the paralleled load control.

Receipt of a framing error during data-address transmission will cause the FE output 202d to be enabled to reset the control logic; the deliberate transmission of a synchronizing framing error signal, at the end of the LCP address-data sequence, also causes FE output 202d to be enabled and reset the control logic preparatory to receipt of a next transmission. This is used to synchronize all of the LCPs with the central facility.

Latches 210 each now store a byte of data in true-data format. The relay clock circuitry 260, having been reset by the temporary disablement of the $\overline{Q}$ output of flip-flop 233, is now again enabled as flip-flop 233 is toggled responsive to receipt of the FE output generated by the reset portion of the data transmission. The four-bit binary counter 263 again counts through its count range and causes each one of the sixteen output lines of decoder 265 to be sequentially enabled, whereby each of the relay driver circuits 270 is sequentially enabled to set each of the sixteen relays either to the "on" or the "off" condition, dependent upon the state of the particular bit contained in the associated latch. As the relay data is present at the latch output in true-data form, inverter 275 is utilized in the "relay off" path between the latch output and the gating and driver associated with the relay "off" driver.

Figure 4C:
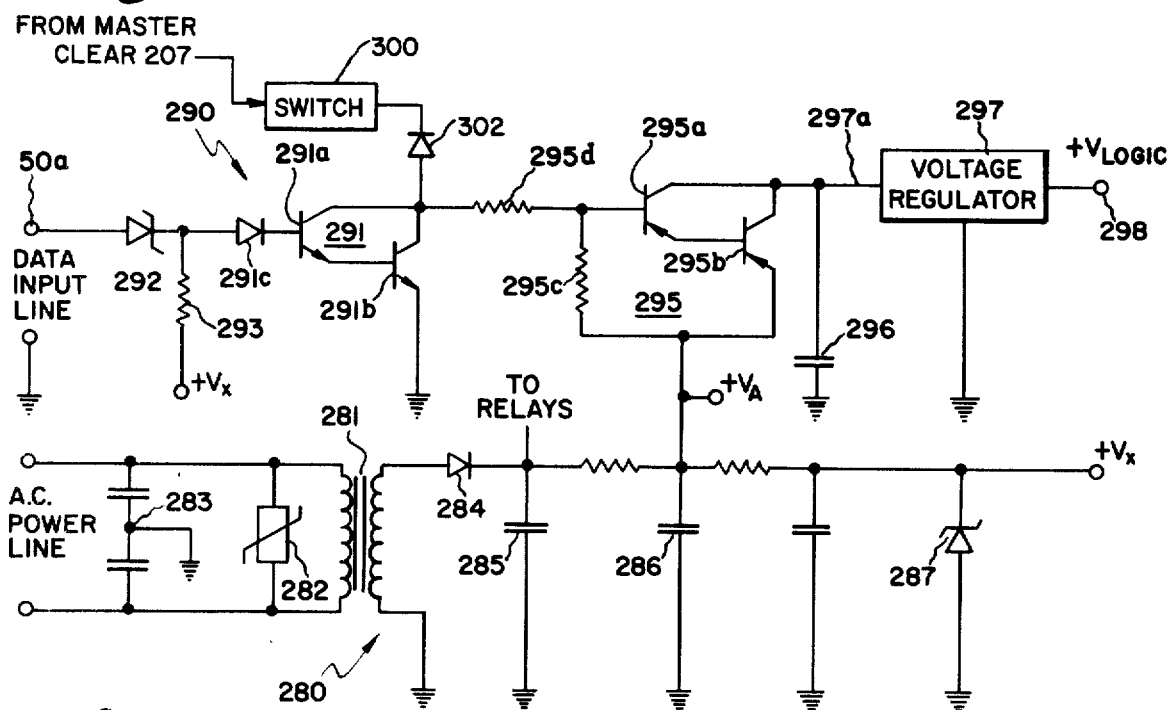

Referring now to FIGS. 4a and 4c, the result of transmitting a PSVR signal to the paralleled receiver-decoders is considered. Each load control processor 50 includes a power supply circuit 280 coupled to the AC power line and including a power transformer 281 and transient suppression means 282 and noise suppression means 283 generally located across the primary of transformer 281. Coupled to the secondary of transformer 281 is a rectifier means 284 and a filter means 285, yielding some DC voltage at the junction therebetween for coupling to the relays and relay driver circuits 270. Additional filtering 286 and overvoltage protection means 287 are utilized to establish two additional DC voltages. $V_A$ and $V_X$, of positive polarity in the illustrated embodiment.

The powersaver circuit 290 includes a Darlington amplifier 291, comprised of first and second Darlington transistors 291a and 291b, with a protection diode 291c having its cathode coupled to the base of transistor 291a. A Zener diode 292 has its anode coupled to data line input terminal 50a and its cathode coupled to the anode of signal diode 291c. A resistor 293 is coupled between the junction of diodes 291c and 292 and the $+V_X$ power supply output. A series-pass Darlington switch 295 includes Darlington pass transistors 295a and 295b coupled between the power supply $+V_A$ output and a filter capacitor 296, in parallel with the input terminal 297a of a voltage regulator 297. The power supply switch circuit 295 also includes a resistive biasing network comprised of resistors 295c and 295d, coupled between voltage $V_A$ and the output of the Darlington transistors 291. The output of the voltage regulator, at terminal 298 supplies the positive voltage necessary to operate the integrated circuits utilized to implement the logic of the LCP.

In operation, the data transmitted to LCP data input terminal 50a is of the positive-true type, i.e. a binary zero level generally corresponding to a voltage level of about zero volts and a binary-one logic level generally corresponding to some positive voltage level (typically on the order of +15 volts for CMOS logic). During normal data transmission, it will be seen that the voltage at terminal 50a is nover less than zero, whereby the voltage on the anode of signal diode 291c, and hence across the base-emitter junctions of Darlington transistors 291a and 291b, is always positive. Hence, the Darlington transistor base-emitter junctions are forward biased and the magnitude of resistor 293 is adjusted to place the Darlington pair in saturation, with the result that the end of resistor 295d furthest from transistor 295a, is substantially at ground potential. The resistive divider comprised of resistors 295c and 295d is chosen such that the Darlington switch transistors 295a and 295b are in saturation whereby substantially the full magnitude of voltage $V_A$ appears at the input 297a of the voltage regulator. The magnitude of voltage $V_A$ is chosen to be larger than the required logic voltage $V_{LOGIC}$, such that regulator 297 operates and the proper logic voltage is available at output terminal 298 to allow proper operation of the LCP.

The Zener voltage of diode 292 is chosen such that when the negative magnitude PSVR signal is received, the sum of that negative voltage plus the positive Zener voltage is such that a negative voltage still appears at the anode of signal diode 291c. The base-emitter junctions of both Darlington transistors 291a and 291b are reverse-biased and the transistors are then in the cut-off condition, placing each of the Darlington transistors 295a and 295b also in the cut-off condition, whereby current does not flow to the input 297a of the voltage regulator. The magnitude of the logic voltage at regulator output 298 falls substantially to zero, and not only prevents operation of the receiver/decoder but also prevents any substantial power consumption by the circuitry of the LCP. As previously explained hereinabove, the negative DC voltage level utilized for the powersaver function is removed to again provide a non-negative voltage at data input 50a and allow the receiver/decoder logic circuitry to be re-powered and readied for subsequent receipt of new data transmissions.

Advantageously, the master clear circuitry 207 recognizes re-application of mains power after some finite time interval of absence thereof, with the time interval being set by means well known to the art, and, if jumper 208 is intact, applies the reset signal to a switch means 300, which may comprise another Darlington amplifier similar to Darlington 291. The output of switch means 300 is coupled to the output of switch 291 through a protection diode 302. Thus, when mains power is reestablished, any PSVR signal at LCP input 50a is effectively overriden by enablement of switch means 300 response to the master clear reset output, to cause saturation of Darlington switch 295 and provide for the operation potential of the LCP. The same reset output is coupled, via jumper 208, to the clear, or reset, inputs 220a and 220b, of respective latches 210a and 210b. The latch outputs are all reset to a binary zero state, while a preset input P of flip-flop 233 is enabled to establish energization of the Q output thereof (corresponding to relay cycling enablement). The load distribution clock 260 cycles the relay drive circuits 270. If the above-described repositioning of inverters 275, in the first 8 relay drivers, is accomplished, the latch outputs thereto are at a binary zero state and cause the fixtures to be in the "on" condition (due to the logic inversion prior to the relay-on driver 271a); the logic zero outputs of the remaining latch then cause the "hi-lo" drivers to be in the "low" lighting condition, whereby all fixtures are turned on after a power-outage, but are placed in a low lighting condition. The fixtures remain in this condition until the central facility has loaded the now-stored data from the mass data storage means (transferred thereto from RAM 12c responsive to the power outage) back to RAM and the proper time comparisons and map selection has been made. Once the map is selected, the CPU causes that map energy utilization pattern to be implemented and the overall low lighting condition is replaced by the proper lighting pattern for that time-of-day and day-of-week. Thus, even if mains power is temporarily removed, the system continues to function in manner such that some lighting is provided as soon as the power is restored.

If the "power-up reset" option is not desired, the jumper 208 is removed. Upon restoration of AC mains power, the relays (being of the latching type) remain in the same states as prior to the power outage and the prior energy utilization pattern is restored, until subsequently modified by the system's normal map-time-matching technique. Note that if the option is not to be used, the data bytes may both be transmitted in normal data-true fashion and the coupling of inverters 275 and would then always be to the input of the "relay-off" AND gate 274b.

There has just been described a novel load control processor for use in an energy load controller system capable of being programmed to define each of several maps of energy utilization load programming in a plurality of sectors, with each LCP being capable of controlling a plurality of controllable loads coupled thereto. Novel receiver/decoder circuitry useful in the load control processors of the programmable energy load controller system has been disclosed, as well as novel means for reducing LCP power consumption when data reception and load changes are not in progress.

While one presently preferred embodiment of the present invention has been disclosed herein, various modifications and variations will now become apparent to those skilled in the art. It is our intent, therefore, to be limited only by the appending claims and not by the specifics of the single embodiment presented herein.

What is claimed is:

1. A load control processor for establishing the energy consumption state of each of at least one load-controlling relay coupled thereto, comprising:
    means for receiving a data transmission having at least one bit of data sent in a data-error-detecting format;
    first means for driving each load-controlling relay to one of an enabled and a disabled state;
    means for establishing a unique address for said load control processor;
    receiver-decoder means comprising second means coupled to said data transmission receiving means for storing the information in said data transmission, said transmission sequentially containing an address information portion and a load-control information portion;
    third means coupled to said second means for detecting, in accordance with the error-detecting code format used, a data error in any bit of data in each of the received address and load-control portions of the transmitted information;
    fourth means for comparing the transmitted address information with the unique address established for said load control processor;
    fifth means for enabling said first means in accordance with the load-control information stored in said second means to cause said relays to be enabled or disabled responsive thereto;
    sixth means for resetting said second through fifth means if said third means detects an error in the information received by the load control processor; and
    seventh means for supplying operating potential to said first means and said receiver-decoder means.

2. The load control processor as set forth in claim 1, wherein said first means is configured to drive a plurality of load-controlling relays; and further including means for sequentially driving each of said plurality of relays to the state required therefor responsive to the load-control information stored in said second means.

3. The load control processor of claim 2, further comprising means for temporarily disabling said first means at least when said address and load-control information portions of said data transmission are being received by said transmission receiving means.

4. The load control processor of claim 1, further comprising means for temporarily disabling said first means at least when said address and load-control portions of said data transmission are being received by said transmission receiving means.

5. The load control processor as set forth in claim 1, further including means coupled to said data transmission receiving means for recognizing a preselected condition to disable said operating potential supply means.

6. The load control processor of claim 5, wherein said preselected condition recognizing means includes switch means coupled between said operating potential supplying means and at least said receiver-decoder means for substantially opening a path of current flow therebetween responsive to said preselected condition.

7. The load control processor as set forth in claim 6, wherein said switch means comprises at least one semiconductor device.

8. The load control processor of claim 5, wherein said data transmission is transmitted with a first voltage polarity and said preselected condition is set as a voltage of the opposite polarity.

9. The load control processor set forth in claim 1, wherein said second means comprises first and second data latch means each capable of storing a plurality of bits of information, each latch having an input and an output associated with each bit capable of being stored therein, with like-ordered-bit inputs of both latches being coupled in parallel to receive a bit of information from said data transmission receiving means; and a sequential-state counter for enabling storage of each sequential bit of the data transmission in the appropriate data latch.

10. The load control processor as set forth in claim 9, wherein said data transmission is sent in complementary-redundant encoded format; and said sequential-state controller and said fourth and fifth means cooperate to enable said sixth means if the information transmitted in a first part of each of the address and data information portions of the data transmission is not the complement of the information transmitted in the next successive portion of the transmission.

11. The load control processor as set forth in claim 1, further comprising means coupled to said eighth means for enabling said first means to energize at least some of said loads after any temporary cessation of functioning of said seventh means.

* * * * *